United States Patent
Wong et al.

(10) Patent No.: US 6,742,248 B2
(45) Date of Patent: Jun. 1, 2004

(54) METHOD OF FORMING A SOLDERED ELECTRICAL CONNECTION

(75) Inventors: Boon Wong, Torrance, CA (US); Robert E. Silhavy, Redondo Beach, CA (US); Jennifer Shinno, S. Pasadena, CA (US)

(73) Assignee: The Boeing Company, Seattle, WA (US)

(*) Notice: Subject to any disclaimer, the term of this patent is extended or adjusted under 35 U.S.C. 154(b) by 250 days.

(21) Appl. No.: 09/855,233

(22) Filed: May 14, 2001

(65) Prior Publication Data

US 2002/0166230 A1 Nov. 14, 2002

(51) Int. Cl.$^7$ ................................................ H05K 3/34
(52) U.S. Cl. .............................. 29/840; 29/832; 29/830; 29/874; 174/250; 174/261; 228/180.21; 228/180.22; 428/632; 257/737; 257/738
(58) Field of Search .......................... 29/840, 830, 832, 29/834, 846, 827, 874; 174/261, 260, 250; 257/737, 738; 361/760; 428/343, 356, 632; 228/180.22, 208 F

(56) References Cited

U.S. PATENT DOCUMENTS

| | | | | |
|---|---|---|---|---|
| 4,268,849 A | * | 5/1981 | Gray et al. ................... 357/71 |
| 5,249,728 A | * | 10/1993 | Lam ........................... 228/111 |
| 5,466,972 A | * | 11/1995 | Frank et al. ................. 257/764 |
| 5,587,336 A | * | 12/1996 | Wang et al. ................. 437/183 |
| 5,616,423 A | * | 4/1997 | Sanjyou et al. ............. 428/632 |
| 5,725,938 A | * | 3/1998 | Jin et al. ..................... 428/210 |
| 5,803,343 A | * | 9/1998 | Sarma et al. .......... 228/180.21 |
| 5,918,364 A | * | 7/1999 | Kulesza et al. ............... 29/832 |
| 6,153,940 A | * | 11/2000 | Zakel et al. ................. 257/779 |
| 2002/0166230 A1 | * | 11/2002 | Wong et al. .................. 29/840 |

* cited by examiner

Primary Examiner—Carl J. Arbes
Assistant Examiner—Minh Trinh

(57) ABSTRACT

A reliable, long-lived soldered electrical connection is made to a ceramic substrate having a thick-film metallization thereon, over which is deposited a joint-structure-stabilizing thin-film metallization. The thin-film metallization is a multilayered structure having an adhesion layer overlying and in contact with the thick-film metallization, a readily wettable base-metal layer overlying and in contact with the adhesion layer, and an oxidation-prevention layer overlying and in contact with the base-metal layer. An electrical conductor is soldered to the thin-film metallization of the ceramic substrate. The electrical conductor may be a bonding pad of a flip chip having a solder bump thereon.

20 Claims, 3 Drawing Sheets

METHOD OF FORMING A SOLDERED ELECTRICAL CONNECTION

This invention relates to the fabrication of a structure having a reliable, long-lived soldered electrical connection to a metallized ceramic substrate and, more particularly, to the fabrication of a structure with a flip chip electrically and structurally connected to the metallized ceramic substrate.

BACKGROUND OF THE INVENTION

In one common architecture, a microelectronic chip is fabricated with large numbers of interconnected microelectronic circuits thereon. The microelectronic chip has input and output terminals of the microelectronic circuits on an external surface of the microelectronic chip. One form of the terminals is solder bumps which protrude above the external surface of the microelectronic chip.

A number of the microelectronic chips and other electronic devices may be supported on a ceramic substrate with metallized interconnections on the surface of the substrate. The metallization on the substrate provides interconnection between the microelectronic chips and also serves as a structural support for the fragile microelectronic chips. The substrate is typically made of a single-layer of ceramic material with the electrically conductive metallization traces on its surface, or multiple layers of ceramic material with electrically conductive traces on the various levels of the ceramic structure and vertical interconnects between the levels.

The microelectronic chip is attached to the substrate by affixing the solder bumps to the appropriate locations on the conductive traces of the substrate. The affixing is accomplished by fluxing the solder bumps and the traces, contacting the solder bumps to the metallization traces in an oven which heats the solder to a temperature above its liquidus temperature to cause it to reflow, and then cooling the assembly to below the solidus temperature allowing proper solidification of the solder, forming a conductive interconnect. The flux is thereafter removed. The solder joint between the solder bumps and the metallization on the substrate in this "flip chip" design serves both as the structural attachment and the electrical attachment of the microelectronic chip to the substrate.

The removal of the flux is a time-consuming task that adds to the product cost. The inventors have also recognized that the use of the flux may have adverse effects on the microelectronic chip itself. For example, where the microelectronic chip is based on silicon (Si) or gallium arsenide (GaAs) technology, the flux may contaminate the sensitive microcircuits. The flux residue may also result in environmental contamination. The inventors have recognized a need for a joining approach that overcomes these problems that arise from the use of flux-based solder joining of microelectronic chips to substrates. The present invention fulfills this need, and further provides related advantages.

SUMMARY OF THE INVENTION

The present invention provides a method for forming a soldered connection, and a metallized ceramic substrate that may be used in the method. The approach is particularly useful for forming solder joint electrical and structural connections between flip chips and metallized ceramic substrates, but it may be used more widely. The soldering method achieves the solder joining without the use of a flux and without a substantial modification to the composition of the solder.

In accordance with the invention, a method of forming a soldered electrical connection comprises the steps of providing a ceramic substrate having a thick-film metallization thereon, and depositing a joint-stabilizing, thin-film metallization overlying the thick-film metallization. The thin-film metallization comprises an adhesion layer overlying and in contact with the thick-film metallization, a readily wettable base-metal layer overlying and in contact with the adhesion layer, and an oxidation-prevention layer overlying and in contact with the base-metal layer. The method further includes providing an electrical conductor, and soldering the electrical conductor to the thin-film metallization of the ceramic substrate.

In a preferred application the electrical conductor is a bonding pad of a flip chip having a solder bump thereon. The step of soldering includes the steps of placing the bonding pad having the solder bump thereon in contact with the thin-film metallization, and heating the solder bump to a temperature greater than its liquidus temperature.

The adhesion layer is preferably a metal selected from the group consisting of titanium, titanium-tungsten, and chromium, and preferably has a thickness of from about 25 nanometers to about 100 nanometers. The base-metal layer is a metal selected from the group consisting of copper, nickel, and alloys thereof, and preferably has a thickness of from about 0.15 micrometers to about 5 micrometers, most preferably from about 0.75 micrometers to about 3 micrometers. The oxidation-prevention layer is a metal selected from the group consisting of gold and silver, and has a preferred thickness of from about 70 nanometers to about 600 nanometers, most preferably from about 100 nanometers to about 200 nanometers. The thick-film metallization comprises a precious metal selected from the group consisting of gold, silver, platinum, palladium, and combinations thereof.

The adhesion layer of the thin-film metallization ensures the adhesion of the overlying base-metal layer to the underlying thick-film metallization. Consequently, it is made relatively thin. The base-metal layer serves three functions. It is the layer to which the soldering is accomplished, it acts as an electrical conductor in the final assembly, and it also prevents diffusion of the underlying thick-film metallization into the liquid solder during the soldering step and into the solid solder during post-soldering processes and subsequent mission operations. Such diffusion would otherwise tend to convert the solder to a low-melting solid and reduce its creep-fatigue resistance. Maintaining good creep-fatigue resistance is an important consideration where the solder serves the structural function of attaching the flip chip to the metallized ceramic, and where the solder must retain its structural integrity through thermal strain cycles during post-soldering assembly processes and mission operation. The oxidation-prevention layer prevents oxidation of the structure during storage. Such oxidation, if it were to occur, would prevent soldering or would require fluxing of the metallization prior to soldering, which in turn would require cleanup of the flux after soldering is complete. The oxidation-prevention layer prevents such oxidation and allows subsequent good wetting during soldering without the use of a flux. The oxidation-prevention layer dissolves into the liquid solder during the soldering operation, and it is therefore made as thin as possible consistent with the need to achieve durable full coverage of the surface of the base-metal layer. Each of the layers of the thin-film metallization thus performs an important function in the thin-film metallization in cooperation with the other layers.

The present invention achieves high reliability of the soldered structure through a high resistance to chemical and mechanical, and therefore electrical, degradation of solder bump joints during subsequent assembly and in service operational environments.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
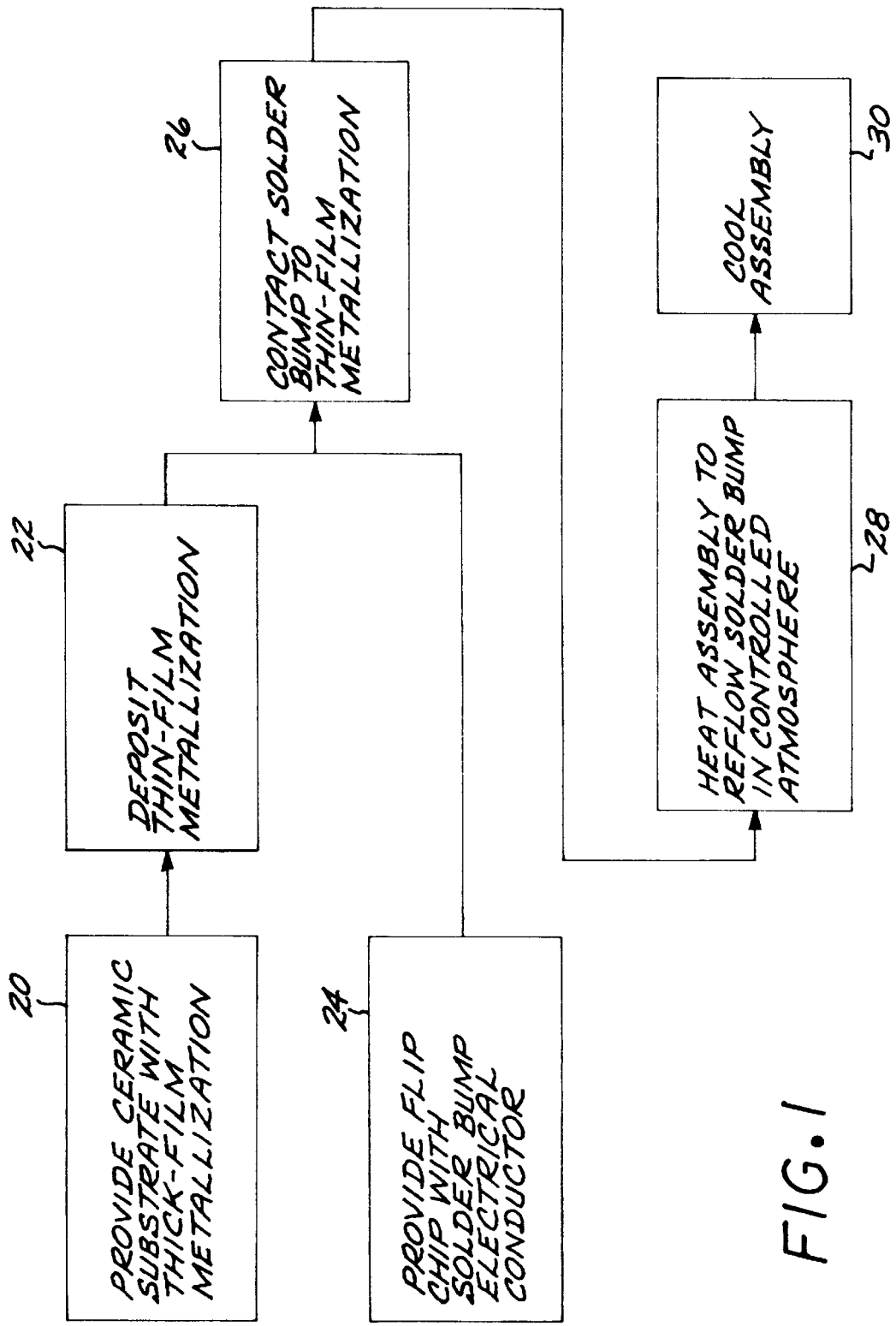
FIG. 1 is a block flow diagram of an approach for practicing the invention.
Figure 2:
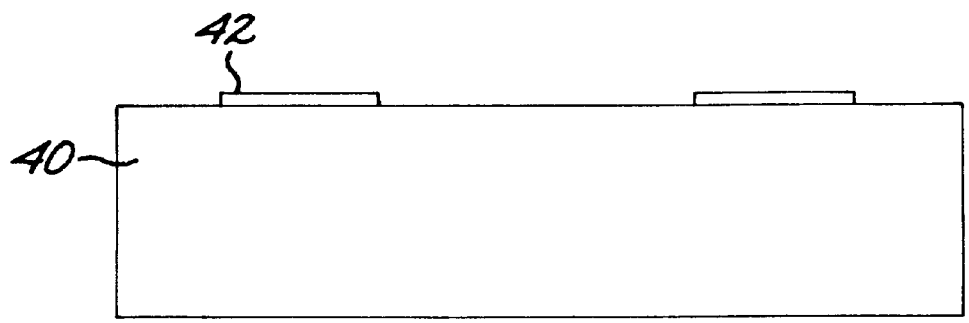
FIG. 2 is an elevational view of a ceramic substrate having a thick-film metallization.
Figure 3:
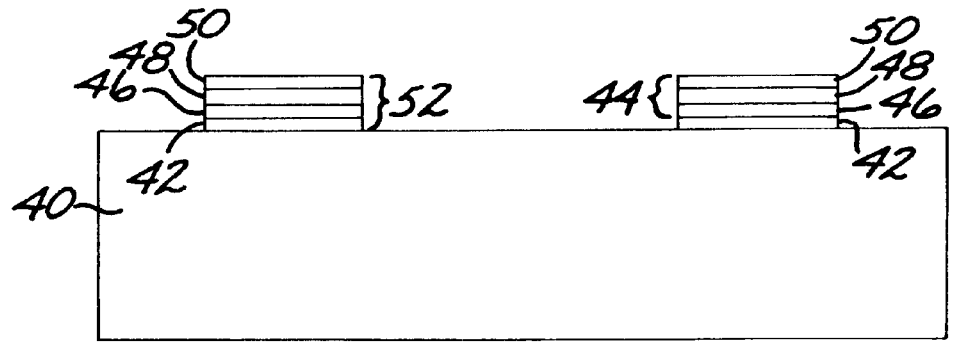
FIG. 3 is a schematic elevational view of the ceramic substrate having a thin-film metallization deposited overlying and contacting the thick-film metallization.

FIG. 1 illustrates an approach for practicing the invention. A ceramic substrate with a thick-film metallization is provided, numeral 20. FIG. 2 illustrates the ceramic substrate 40 with the patterned thick-film metallization 42 that serves as an electrical conductor trace. (FIGS. 2–6 are not drawn to scale.) The ceramic substrate 40 is made of any operable ceramic material, such as low-temperature cofired ceramic (LTCC, a glass-ceramic composite mix or recrystallized glass) or other ceramics such as aluminum oxide. It is dimensioned as necessary to accommodate the microelectronic devices to be attached to it. The patterned thick-film metallization 42 overlies, is in contact with, and is bonded to a surface of the ceramic substrate 40. An example is a metallization on an LTCC multilayer substrate. The thick-film metallization is preferably made of a high-conductivity precious metal such as gold, silver, platinum, palladium, and combinations (alloys) thereof and typically has a thickness of from about 50 micrometers to about 125 micrometers.

A thin-film metallization is deposited over the thick-film metallization 42 of the ceramic substrate 40, numeral 22. The thin-film metallization 44, shown in FIG. 3, comprises three layers. An adhesion layer 46 overlies, is in contact with, and is bonded to the thick-film metallization 42. The subsequently applied overlying layers of the thin-film metallization do not themselves adhere well to the thick-film metallization 42. The adhesion layer 46 serves to adhere the overlying layers of the thin-film metallization 44 to the thick-film metallization, somewhat in the manner of an adhesive. The adhesion layer 46 is preferably a metal selected from the group consisting of titanium, titanium-tungsten and chromium. The adhesion layer 46 preferably has a thickness of from about 25 nanometers to about 100 nanometers.

A base-metal layer 48 overlies, is in contact with, and is bonded to the adhesion layer 46. The base-metal layer 48 serves three primary functions. First, it is the material to which the solder bonds in a subsequent soldering operation. It must therefore have sufficient strength and must be wetted by the solder. Second, it is an electrical conductor from the solder to the thick-film metallization 42 in the final soldered article. The base-metal layer is thin, but it must still have sufficiently low electrical resistivity so as not to add an unduly high electrical resistance. Third, it serves as a diffusion barrier to prevent diffusion of the metal of the underlying thick-film metallization 42 into the liquid solder during soldering and into the solder joint during subsequent assembly processes and in-service operation. This latter consideration has not been recognized in some prior processes wherein the soldering is made directly to a thick film of a precious metal such as gold. In these cases, the liquid solder (and the solid solder during subsequent service) dissolves some of the precious metal, which in turn forms a low-melting alloy at the solder-to-metallization interface that chemically and mechanically degrades the joint integrity. The lowering of the melting point and the microstructural degradation of the solder weakens the creep-fatigue resistance of the joint. The solder joint is subjected to thermal cycling strains during service, and good creep-fatigue resistance is required in order to prevent premature failure of the solder joint in these circumstances.

To perform these several functions, the base-metal layer 48 is preferably copper, nickel, or alloys thereof (the alloys being solid solutions), which have a higher (typically much higher) melting point than typical solders and therefore can serve as solid diffusion barriers during soldering operations. These metals have sufficient strength and are wetted by conventional solders such as lead-tin solders. In addition, these metals have a sufficiently high melting temperature; their interaction, for example with lead-containing solders, will not produce low-melting eutectics. Therefore their presence creates a barrier and allows no diffusion of the metal in the thick-film metallization 42 into the solder. The base-metal layer 48 has a thickness and relative density (preferably pore free) which are sufficiently great to function as the diffusion barrier. The base-metal layer 48 is preferably from about 0.15 micrometers to about 5 micrometers, most preferably from about 0.75 to about 3 micrometers thick. If the base-metal layer were thinner, there would be a risk that it would not serve properly as a diffusion barrier.

An oxidation-prevention layer 50 overlies, is in contact with, and is bonded to the base-metal layer 48. The oxidation-prevention layer prevents oxidation of the base-metal layer 48 during fabrication and storage prior to the soldering operation. This prevention of oxidation is necessary to avoid the use of a flux during subsequent soldering processes. If an oxide were allowed to develop on the base-metal layer 48, it would have to be removed with a flux, and then the article would later have to be cleaned to remove the flux.

The oxidation-prevention layer 50 is preferably a metal selected from the group consisting of gold and silver. The oxidation-prevention layer 50 preferably has a thickness of from about 70 nanometers to about 600 nanometers, most preferably from about 100 nanometers to about 200 nanometers. In the subsequent soldering operation, the oxidation-prevention layer 50 is dissolved into the liquid solder. As discussed above, the result is an alloyed solder which is generally undesirable. However, because the oxidation-prevention layer 50 is very thin, the total amount of the addition of the metal of the oxidation-prevention layer 50 to the solder is quite small and does not have a substantial adverse effect on the microstructure and therefore the properties of the solder. The oxidation-prevention layer 50 is therefore preferably as thin as possible. However, studies have shown that it cannot be less than about 70 nanometers in thickness, because it does not achieve reliable coverage over the entire surface of the base-metal layer 48 when its average thickness is thinner than about 70 nanometers. A thickness of greater than about 600 nanometers results in too great an alloying addition to the liquid solder, but a maximum thickness of about 200 nanometers is even more preferred in order to hold the alloying of the solder to an even lower level.

Although there are three layers in the thin-film metallization 44, their preferred total thickness is only about 1–2 micrometers. The three layers therefore are properly characterized as the thin-film metallization 44. The thick-film metallization 42 and the thin-film metallization 44 are collectively termed the metallization 52.

The layers 46, 48, and 50 may be deposited by any operable procedure. Examples of preferred approaches include vacuum evaporation, sputtering, chemical vapor deposition, and electrodeposition.

Figure 4:
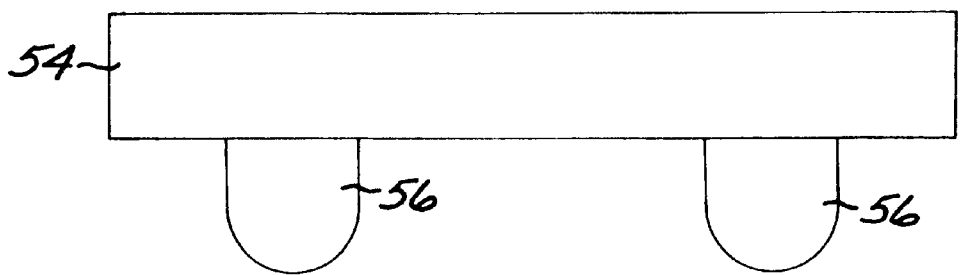
FIG. 4 is an elevational view of a flip chip having a solder bump electrical connector.

An electrical conductor is provided. In the illustrated preferred case, a flip chip with a solder bump electrical conductor is provided, numeral 24. FIG. 4 illustrates the flip chip 54 with solder bumps 56 that serve as electrical conductors. The flip chip 54 is of any operable type of integrated circuit and other components, and many such arrangements are known in the art. The details of the structure of the flip chip 54 are not within the scope of the present invention. The solder bumps 56 are of any operable type, but are preferably made of a lead-tin solder with a high lead content, most preferably 97 weight percent lead-3 weight percent tin.

Figure 5:
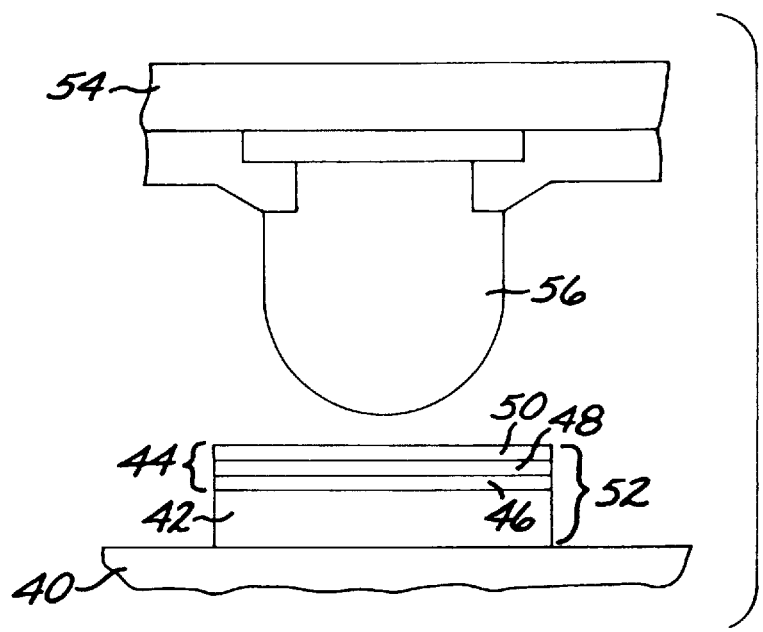
FIG. 5 is a schematic elevational view of the metallization of the ceramic substrate aligned with the solder bump of the flip chip prior to contacting the metallization and the solder bump.

The solder bumps 56 are contacted to the metallization 52, specifically directly to the thin-film metallization 44, numeral 26. This contacting is accomplishing by positioning the flip chip 54 so that the solder bumps 56 are in aligned registry with the proper locations on the metallization 52 of the ceramic substrate 40, and then bringing the two components into contact to form an assembly. FIG. 5 shows one of the solder bumps 56 in the process of being contacted to the metallization 52, but just prior to contact.

The solder bumps 56 are heated to a soldering temperature above their liquidus temperature, in a controlled atmosphere such as nitrogen or argon, to reflow the solder. This heating is most readily accomplished by heating the assembly of flip chip 54 and ceramic substrate 40 with the deposited metallization 52 in a furnace to the required soldering temperature, numeral 28. At this temperature, the solder bumps 56 melt and reflow, the oxidation-prevention layer 50 dissolves into the molten solder, and the resulting liquid solder wets the base-metal layer 48. In the case of the most preferred solder having a composition of 97 weight percent lead-3 weight percent tin, the soldering temperature is about 350–360° C. The step 28 may occur simultaneously with the step 26 so that the solder is liquid when the two components are first contacted together, or the step 28 may occur after the step 26 so that the components are contacted together when the solder is solid, and the solder is thereafter melted.

The assembly is thereafter cooled to room temperature, numeral 30. The solder solidifies, forming a mechanical and electrical bond to the metallization 52 and thence to the ceramic substrate 40.

Figure 6:
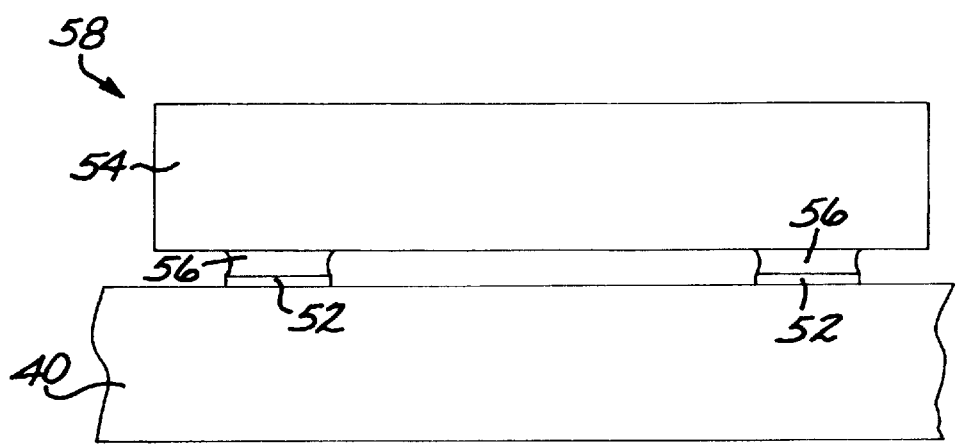
FIG. 6 is a schematic elevational depiction of the flip chip bonded to the metallized ceramic substrate.

FIG. 6 illustrates the final joined assembly 58. The solder bump 56, now a solder joint, has a final shape that is preferably in the form of an hourglass, with a broad base adjacent to the body of the flip chip 54, a broad base adjacent to the metallization 52, and a thinner middle region. This hourglass shape indicates good wetting (a good mechanical bond) and provides excellent reliability and fatigue resistance to the assembly.

The present invention has been reduced to practice in the manner described in relation to FIG. 1. There was excellent wetting of the solder to the thin-film metallization, producing the desired hourglass-shaped profile with a high creep-fatigue resistance. The joined assembly was post-processed by subsequent module assembly processes and functionally survived through accelerated life testing. After seven equivalent mission lives, the tested assemblies exhibited no significant microstructural degradation (e.g., excessive creep cavities and interfacial reaction products) and retained their electrical functions per their specification.

An identical comparison specimen was prepared, except that no thin-film metallization was deposited on the thick-film metallization (i.e., step 22 was omitted). In spite of achieving good wetting and the hourglass shape, after the same post-processing and life testing there was microscopic evidence of creep cavitation and excessive reaction products. In addition, electrical performance was significantly degraded in these assemblies.

It has been known in the past to solder directly to thick-film metallization with no thin-film metallization present. This approach permits a large amount of the metal of the thick-film metallization to dissolve into and react with the solder, forming a multicomponent solder whose properties are significantly changed from the binary solder. The present approach is to be distinguished from such an approach, because the presence of the base-metal layer diffusionally isolates the solder from the thick-film metallization and limits the amount of alloy metal that can dissolve into the solder.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method of forming a soldered electrical connection, comprising the steps of
   providing a ceramic substrate having a thick-film metallization thereon;
   depositing a thin-film metallization overlying the thick-film metallization, the thin-film metallization comprising:
      an adhesion layer overlying and in contact with the thick-film metallization,
      a base-metal layer overlying and in contact with the adhesion layer, and
      an oxidation-prevention layer overlying and in contact with the base-metal layer;
   providing an electrical conductor; and
   soldering the electrical conductor to the thin-film metallization of the ceramic substrate.

2. The method of claim 1, wherein
   the adhesion layer is a metal selected from the group consisting of titanium, titanium-tungsten, and chromium.

3. The method of claim 2, wherein
   the adhesion layer has a thickness of from about 25 nanometers to about 100 nanometers.

4. The method of claim 1, wherein
the base-metal layer is a metal selected from the group consisting of copper, nickel, and alloys thereof.

5. The method of claim 4, wherein
the base-metal layer has a thickness of from about 0.75 micrometers to about 5 micrometers.

6. The method of claim 1, wherein
the oxidation-prevention layer is a metal selected from the group consisting of gold and silver.

7. The method of claim 6, wherein
the oxidation-prevention layer has a thickness of from about 70 nanometers to about 600 nanometers.

8. The method of claim 6, wherein
the oxidation-prevention layer has a thickness of from about 10 nanometers to about 200 nanometers.

9. The method of claim 1, wherein the thick-film metallization comprises a precious metal selected from the group consisting of gold, platinum, palladium, and combinations thereof.

10. A metallized ceramic substrate, comprising:
a ceramic substrate having a thick-film metallization thereon;
a thin-film metallization overlying the thick-film metallization, the thin-film metallization comprising:
an adhesion layer overlying and in contact with the thick-film metallization,
a base-metal layer overlying and in contact with the adhesion layer, and
an oxidation-prevention layer overlying and in contact with the base-metal layer.

11. The metallized ceramic substrate of claim 10, wherein
the adhesion layer is a metal selected from the group consisting of titanium, titanium-tungsten, and chromium.

12. The metallized ceramic substrate of claim 11, wherein
the adhesion layer has a thickness of from about 25 nanometers to about 100 nanometers.

13. The metallized ceramic substrate of claim 10, wherein
the base-metal layer is a metal selected from the group consisting of copper, nickel, and alloys thereof.

14. The metallized ceramic substrate of claim 13, wherein
the base-metal layer has a thickness of from about 0.15 micrometers to about 5 micrometers.

15. The metallized ceramic substrate of claim 10, wherein
the oxidation-prevention layer is a metal selected from the group consisting of gold and silver.

16. The metallized ceramic substrate of claim 15, wherein
the oxidation-prevention layer has a thickness of from about 70 nanometers to about 600 nanometers.

17. The metallized ceramic substrate of claim 15, wherein
the oxidation-prevention layer has a thickness of from about 100 nanometers to about 200 nanometers.

18. The metallized ceramic substrate of claim 10, wherein
the thick-film metallization comprises a precious metal selected from the group consisting of gold, silver, platinum, palladium, and combinations thereof.

19. A method of forming a soldered electrical connection, comprising the steps of providing a ceramic substrate having a thick-film metallization thereon;
depositing a thin-film metallization overlying the thick-film metallization, the thin-film metallization including:
an adhesion layer overlying and in contact with the thick-film metallization,
a base-metal layer overlying and in contact with the adhesion layer, and
an oxidation-prevention layer overlying and in contact with the base-metal layer;
providing an electrical conductor, wherein the electrical conductor is a bonding pad of a flip chip having a solder bump and
soldering the electrical conductor to the thin-film metallization of the ceramic substrate, wherein the step of soldering includes the steps of
placing the bonding pad having the solder bump thereon in contact with the thin-film metallization, and
heating the solder bump to a temperature greater than its liquidus temperature.

20. A method of forming a soldered electrical connection, comprising the steps of
providing a ceramic substrate having a thick-film metallization thereon, wherein the thick-film metallization comprises a precious metal selected from the group consisting of gold, platinum, palladium, and combinations thereof;
depositing a thin-film metallization overlying the thick-film metallization, the thin-film metallization comprising:
an adhesion layer overlying and in contact with the thick-film metallization, wherein the adhesion layer is a metal selected from the group consisting of titanium, titanium-tungsten, and chromium, and wherein the adhesion layer has a thickness of from about 25 nanometers to about 100 nanometers,
a base-metal layer overlying and in contact with the adhesion layer, wherein the base-metal layer is a metal selected from the group consisting of copper, nickel, and alloys thereof, and wherein the base-metal layer has a thickness of from about 0.15 micrometers to about 5 micrometers, and
an oxidation-prevention layer overlying and in contact with the base-metal layer the oxidation-prevention layer is a metal selected from the group consisting of gold and silver, and wherein the oxidation-prevention layer has a thickness of from about 70 nanometers to about 600 nanometers;
providing a flip chip having a bonding pad with a solder bump thereon;
placing the bonding pad having the solder bump thereon in contact with the thin-film metallization, and
heating the solder bump to a temperature greater than its liquidus temperature to solder the bonding pad to the thin-film metallization.

* * * * *